(12) United States Patent
Dangi et al.

(10) Patent No.: US 10,939,132 B2
(45) Date of Patent: Mar. 2, 2021

(54) GENERATING A DATA STREAM WITH CONFIGURABLE COMPRESSION

(71) Applicant: EMC IP Holding Company LLC, Hopkinton, MA (US)

(72) Inventors: Salil Dangi, Mission Viejo, CA (US); Ernest Daza, Aliso Viejo, CA (US)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 0 days.

(21) Appl. No.: 16/836,004

(22) Filed: Mar. 31, 2020

(65) Prior Publication Data

US 2020/0336757 A1 Oct. 22, 2020

Related U.S. Application Data

(63) Continuation of application No. 16/389,671, filed on Apr. 19, 2019, now Pat. No. 10,638,150.

(51) Int. Cl.
*H04N 19/48* (2014.01)
*H04N 19/184* (2014.01)
*H04L 29/06* (2006.01)

(52) U.S. Cl.
CPC .......... *H04N 19/48* (2014.11); *H04L 65/608* (2013.01); *H04L 65/80* (2013.01); *H04N 19/184* (2014.11)

(58) Field of Classification Search
CPC .... H04N 19/48; H04N 19/184; H04L 65/608; H04L 65/80; H04L 65/605; G11B 20/00007
See application file for complete search history.

(56) References Cited

U.S. PATENT DOCUMENTS 6,816,093 B1* 11/2004 Jaquette ........... G11B 20/00007
341/50
2014/0118541 A1* 5/2014 Lasko ............... G08B 13/19682
348/143

* cited by examiner

*Primary Examiner* — David S Huang
(74) *Attorney, Agent, or Firm* — Workman Nydegger

(57) ABSTRACT

One example method includes receiving a mixed data stream that was created using a first data stream and a second data stream, the mixed data stream having a compressibility of N, where N is a compressibility merging parameter, and the mixed data stream has a compressibility that is between a compressibility of the first data stream and a compressibility of the second data stream, providing the mixed data stream to an application and/or hardware, observing and recording a response of the application and/or hardware to the mixed data stream, and analyzing the response of the response of the application and/or hardware to the mixed data stream.

20 Claims, 15 Drawing Sheets

- 8,184 Bytes of Merged (Interleaved) Sample Sequence Data Generated (Using Constrained primeM Primes)
- seed=0E00000E, primeM1=0103050D, primeM2=0305070B, Data is not compressible

300

302

```
0F03051B  11050719  10060A28  140A0E24  11090F35  170F152F
120C1442  1A141C3A  130F194F  1D192345  14121E5C  201E2A50
15152369  2323315B  16182876  26283866  171B2D83  292D3F71
181E3290  2C32467C  1921379D  2F374D87  1A243CAA  323C5492
1B2741B7  35415B9D  1C2A46C4  384662A8  1D2D4BD1  3B4B69B3
1E3050DE  3E5070BE  1F3355EB  415577C9  20365AF8  445A7ED4
21396005  475F85DF  223C6512  4A648CEA  233F6A1F  4D6993F5
24426F2C  506E9B00  25457439  5373A20B  26487946  5678A916
274B7E53  597DB021  284E8360  5C82B72C  2951886D  5F87BE37
2A548D7A  628CC542  2B579287  6591CC4D  2C5A9794  6896D358
2D5D9CA1  6B9BDA63  2E60A1AE  6EA0E16E  2F63A6BB  71A5E879
3066ABC8  74AAEF84  3169B0D5  77AFF68F  326CB5E2  7AB4FD9A
336FBAEF  7DBA04A5  3472BFFC  80BF0BB0  3575C509  83C412BB
3678CA16  86C919C6  377BCF23  89CE20D1  387ED430  8CD327DC
3981D93D  8FD82EE7  3A84DE4A  92DD35F2  3B87E357  95E23CFD
3C8AE864  98E74408  3D8DED71  9BEC4B13  3E90F27E  9EF1521E
```

304

```
3F93F78B  A1F65929  4096FC98  A4FB6034  419A01A5  A800673F
429D06B2  AB056E4A  43A00BBF  AE0A7555  44A310CC  B10F7C60
45A615D9  B414836B  46A91AE6  B7198A76  47AC1FF3  BA1E9181
48AF2500  BD23988C  49B22A0D  C0289F97  4AB52F1A  C32DA6A2
4BB83427  C632ADAD  4CBB3934  C937B4B8  4DBE3E41  CC3CBBC3
4EC1434E  CF41C2CE  4FC4485B  D246C9D9  50C74D68  D54BD0E4
51CA5275  D850D7EF  52CD5782  DB55DEFA  53D05C8F  DE5AE605
54D3619C  E15FED10  55D666A9  E464F41B  56D96BB6  E769FB26
57DC70C3  EA6F0231  58DF75D0  ED74093C  59E27ADD  F0791047
5AE57FEA  F37E1752  5BE884F7  F6831E5D  5CEB8A04  F9882568
5DEE8F11  FC8D2C73  5EF1941E  FF92337E  5FF4992B  02973A89
60F79E38  059C4194  61FAA345  08A1489F  62FDA852  0BA64FAA
6400AD5F  0EAB56B5  6503B26C  11B05DC0  6606B779  14B564CB
6709BC86  17BA6BD6  680CC193  1ABF72E1  690FC6A0  1DC479EC
6A12CBAD  20C980F7  6B15D0BA  23CE8802  6C18D5C7  26D38F0D
6D1BDAD4  29D89618  6E1EDFE1  2CDD9D23  6F21E4EE  2FE2A42E
7024E9FB  32E7AB39  7127EF08  35ECB244  722AF415  38F1B94F
732DF922  3BF6C05A  7430FE2F  3EFBC765  7534033C  4200CE70
76370849  4505D57B  773A0D56  480ADC86  783D1263  4B0FE391
79401770  4E14EA9C  7A431C7D  5119F1A7  7B46218A  541EF8B2
7C492697  5723FFBD  7D4C2BA4  5A2906C8  7E4F30B1  5D2E0DD3
7F5235BE  603314DE  80553ACB  63381BE9  81583FD8  663D22F4
825B44E5  694229FF  835E49F2  6C47310A  84614EFF  6F4C3815
8564540C  72513F20  86675919  7556462B  876A5E26  785B4D36
886D6333  7B605441  89706840  7E655B4C  8A736D4D  816A6257
8B76725A  846F6962  8C797767  8774706D  8D7C7C74  8A797778
8E7F8181  8D7E7E83  8F82868E  9083858E  90858B9B  93888C99
918890A8  968D93A4  928B95B5  99929AAF  938E9AC2  9C97A1BA
94919FCF  9F9CA8C5  9594A4DC  A2A1AFD0  9697A9E9  A5A6B6DB
979AAEF6  A8ABBDE6  989DB403  ABB0C4F1  99A0B910  AEB5CBFC
9AA3BE1D  B1BAD307  9BA6C32A  B4BFDA12  9CA9C837  B7C4E11D
```

FIG. 3a

| | | | | | |
|---|---|---|---|---|---|
| 9DACCD44 | BAC9E828 | 9EAFD251 | BDCEEF33 | 9FB2D75E | C0D3F63E |
| A0B5DC6B | C3D8FD49 | A1B8E178 | C6DE0454 | A2BBE685 | C9E30B5F |
| A3BEEB92 | CCE8126A | A4C1F09F | CFED1975 | A5C4F5AC | D2F22080 |
| A6C7FAB9 | D5F7278B | A7CAFFC6 | D8FC2E96 | A8CE04D3 | DC0135A1 |
| A9D109E0 | DF063CAC | AAD40EED | E20B43B7 | ABD713FA | E5104AC2 |
| ACDA1907 | E81551CD | ADDD1E14 | EB1A58D8 | AEE02321 | EE1F5FE3 |
| AFE3282E | F12466EE | B0E62D3B | F4296DF9 | B1E93248 | F72E7504 |
| B2EC3755 | FA337C0F | B3EF3C62 | FD38831A | B4F2416F | 003D8A25 |
| B5F5467C | 03429130 | B6F84B89 | 0647983B | B7FB5096 | 094C9F46 |
| B8FE55A3 | 0C51A651 | BA015AB0 | 0F56AD5C | BB045FBD | 125BB467 |
| BC0764CA | 1560BB72 | BD0A69D7 | 1865C27D | BE0D6EE4 | 1B6AC988 |
| BF1073F1 | 1E6FD093 | C01378FE | 2174D79E | C1167E0B | 2479DEA9 |
| C2198318 | 277EE5B4 | C31C8825 | 2A83ECBF | C41F8D32 | 2D88F3CA |
| C522923F | 308DFAD5 | C625974C | 339301E0 | C7289C59 | 369808EB |
| C82BA166 | 399D0FF6 | C92EA673 | 3CA21701 | CA31AB80 | 3FA71E0C |
| CB34B08D | 42AC2517 | CC37B59A | 45B12C22 | CD3ABAA7 | 48B6332D |
| CE3DBFB4 | 4BBB3A38 | CF40C4C1 | 4EC04143 | D043C9CE | 51C5484E |
| D146CEDB | 54CA4F59 | D249D3E8 | 57CF5664 | D34CD8F5 | 5AD45D6F |
| D44FDE02 | 5DD9647A | D552E30F | 60DE6B85 | D655E81C | 63E37290 |
| D758ED29 | 66E8799B | D85BF236 | 69ED80A6 | D95EF743 | 6CF287B1 |
| DA61FC50 | 6FF78EBC | DB65015D | 72FC95C7 | DC68066A | 76019CD2 |
| DD6B0B77 | 7906A3DD | DE6E1084 | 7C0BAAE8 | DF711591 | 7F10B1F3 |
| E0741A9E | 8215B8FE | E1771FAB | 851AC009 | E27A24B8 | 881FC714 |
| E37D29C5 | 8B24CE1F | E4802ED2 | 8E29D52A | E58333DF | 912EDC35 |
| E68638EC | 9433E340 | E7893DF9 | 9738EA4B | E88C4306 | 9A3DF156 |
| E98F4813 | 9D42F861 | EA924D20 | A047FF6C | EB95522D | A34D0677 |
| EC98573A | A6520D82 | ED9B5C47 | A957148D | EE9E6154 | AC5C1B98 |
| EFA16661 | AF6122A3 | F0A46B6E | B26629AE | F1A7707B | B56B30B9 |
| F2AA7588 | B87037C4 | F3AD7A95 | BB753ECF | F4B07FA2 | BE7A45DA |
| F5B384AF | C17F4CE5 | F6B689BC | C48453F0 | F7B98EC9 | C7895AFB |
| F8BC93D6 | CA8E6206 | F9BF98E3 | CD936911 | FAC29DF0 | D098701C |
| FBC5A2FD | D39D7727 | FCC8A80A | D6A27E32 | FDCBAD17 | D9A7853D |
| FECEB224 | DCAC8C48 | FFD1B731 | DFB19353 | 00D4BC3E | E2B69A5E |
| 01D7C14B | E5BBA169 | 02DAC658 | E8C0A874 | 03DDCB65 | EBC5AF7F |
| 04E0D072 | EECAB68A | 05E3D57F | F1CFBD95 | 06E6DA8C | F4D4C4A0 |
| 07E9DF99 | F7D9CBAB | 08ECE4A6 | FADED2B6 | 09EFE9B3 | FDE3D9C1 |
| 0AF2EEC0 | 00E8E0CC | 0BF5F3CD | 03EDE7D7 | 0CF8F8DA | 06F2EEE2 |
| 0DFBFDE7 | 09F7F5ED | 0EFF02F4 | 0CFCFCF8 | 10020801 | 10020403 |
| 11050D0E | 13070B0E | 1208121B | 160C1219 | 130B1728 | 19111924 |
| 140E1C35 | 1C16202F | 15112142 | 1F1B273A | 1614264F | 22202E45 |
| 17172B5C | 25253550 | 181A3069 | 282A3C5B | 191D3576 | 2B2F4366 |
| 1A203A83 | 2E344A71 | 1B233F90 | 3139517C | 1C26449D | 343E5887 |
| 1D2949AA | 37435F92 | 1E2C4EB7 | 3A48669D | 1F2F53C4 | 3D4D6DA8 |
| 203258D1 | 405274B3 | 21355DDE | 43577BBE | 223862EB | 465C82C9 |
| 233B67F8 | 496189D4 | 243E6D05 | 4C6690DF | 25417212 | 4F6B97EA |
| 2644771F | 52709EF5 | 27477C2C | 5575A600 | 284A8139 | 587AAD0B |
| 294D8646 | 5B7FB416 | 2A508B53 | 5E84BB21 | 2B539060 | 6189C22C |
| 2C56956D | 648EC937 | 2D599A7A | 6793D042 | 2E5C9F87 | 6A98D74D |
| 2F5FA494 | 6D9DDE58 | 3062A9A1 | 70A2E563 | 3165AEAE | 73A7EC6E |
| 3268B3BB | 76ACF379 | 336BB8C8 | 79B1FA84 | 346EBDD5 | 7CB7018F |
| 3571C2E2 | 7FBC089A | 3674C7EF | 82C10FA5 | 3777CCFC | 85C616B0 |

FIG. 3b

```
387AD209  88CB1DBB  397DD716  8BD024C6  3A80DC23  8ED52BD1
3B83E130  91DA32DC  3C86E63D  94DF39E7  3D89EB4A  97E440F2
3E8CF057  9AE947FD  3F8FF564  9DEE4F08  4092FA71  A0F35613
4195FF7E  A3F85D1E  4299048B  A6FD6429  439C0998  AA026B34
449F0EA5  AD07723F  45A213B2  B00C794A  46A518BF  B3118055
47A81DCC  B6168760  48AB22D9  B91B8E6B  49AE27E6  BC209576
4AB12CF3  BF259C81  4BB43200  C22AA38C  4CB7370D  C52FAA97
4DBA3C1A  C834B1A2  4EBD4127  CB39B8AD  4FC04634  CE3EBFB8
50C34B41  D143C6C3  51C6504E  D448CDCE  52C9555B  D74DD4D9
53CC5A68  DA52DBE4  54CF5F75  DD57E2EF  55D26482  E05CE9FA
56D5698F  E361F105  57D86E9C  E666F810  58DB73A9  E96BFF1B
59DE78B6  EC710626  5AE17DC3  EF760D31  5BE482D0  F27B143C
5CE787DD  F5801B47  5DEA8CEA  F8852252  5EED91F7  FB8A295D
5FF09704  FE8F3068  60F39C11  01943773  61F6A11E  04993E7E
62F9A62B  079E4589  63FCAB38  0AA34C94  64FFB045  0DA8539F
6602B552  10AD5AAA  6705BA5F  13B261B5  6808BF6C  16B768C0
690BC479  19BC6FCB  6A0EC986  1CC176D6  6B11CE93  1FC67DE1
6C14D3A0  22CB84EC  6D17D8AD  25D08BF7  6E1ADDBA  28D59302
6F1DE2C7  2BDA9A0D  7020E7D4  2EDFA118  7123ECE1  31E4A823
7226F1EE  34E9AF2E  7329F6FB  37EEB639  742CFC08  3AF3BD44
75300115  3DF8C44F  76330622  40FDCB5A  77360B2F  4402D265
7839103C  4707D970  793C1549  4A0CE07B  7A3F1A56  4D11E786
7B421F63  5016EE91  7C452470  531BF59C  7D48297D  5620FCA7
7E4B2E8A  592603B2  7F4E3397  5C2B0ABD  805138A4  5F3011C8
81543DB1  623518D3  825742BE  653A1FDE  835A47CB  683F26E9
845D4CD8  6B442DF4  856051E5  6E4934FF  866356F2  714E3C0A
87665BFF  74534315  8869610C  77584A20  896C6619  7A5D512B
8A6F6B26  7D625836  8B727033  80675F41  8C757540  836C664C
8D787A4D  86716D57  8E7B7F5A  89767462  8F7E8467  8C7B7B6D
90818974  8F808278  91848E81  92858983  9287938E  958A908E
938A989B  988F9799  948D9DA8  9B949EA4  9590A2B5  9E99A5AF
9693A7C2  A19EACBA  9796ACCF  A4A3B3C5  9899B1DC  A7A8BAD0
999CB6E9  AAADC1DB  9A9FBBF6  ADB2C8E6  9BA2C103  B0B7CFF1
9CA5C610  B3BCD6FC  9DA8CB1D  B6C1DE07  9EABD02A  B9C6E512
9FAED537  BCCBEC1D  A0B1DA44  BFD0F328  A1B4DF51  C2D5FA33
A2B7E45E  C5DB013E  A3BAE96B  C8E00849  A4BDEE78  CBE50F54
A5C0F385  CEEA165F  A6C3F892  D1EF1D6A  A7C6FD9F  D4F42475
A8CA02AC  D7F92B80  A9CD07B9  DAFE328B  AAD00CC6  DE033996
ABD311D3  E10840A1  ACD616E0  E40D47AC  ADD91BED  E7124EB7
AEDC20FA  EA1755C2  AFDF2607  ED1C5CCD  B0E22B14  F02163D8
B1E53021  F3266AE3  B2E8352E  F62B71EE  B3EB3A3B  F93078F9
B4EE3F48  FC358004  B5F14455  FF3A870F  B6F44962  023F8E1A
B7F74E6F  05449525  B8FA537C  08499C30  B9FD5889  0B4EA33B
BB005D96  0E53AA46  BC0362A3  1158B151  BD0667B0  145DB85C
BE096CBD  1762BF67  BF0C71CA  1A67C672  C00F76D7  1D6CCD7D
C1127BE4  2071D488  C21580F1  2376DB93  C31885FE  267BE29E
C41B8B0B  2980E9A9  C51E9018  2C85F0B4  C6219525  2F8AF7BF
C7249A32  328FFECA  C8279F3F  359505D5  C92AA44C  389A0CE0
CA2DA959  3B9F13EB  CB30AE66  3EA41AF6  CC33B373  41A92201
CD36B880  44AE290C  CE39BD8D  47B33017  CF3CC29A  4AB83722
D03FC7A7  4DBD3E2D  D142CCB4  50C24538  D245D1C1  53C74C43
D348D6CE  56CC534E  D44BDBDB  59D15A59  D54EE0E8  5CD66164
```

FIG. 3c

```
D651E5F5  5FDB686F  D754EB02  62E06F7A  D857F00F  65E57685
D95AF51C  68EA7D90  DA5DFA29  6BEF849B  DB60FF36  6EF48BA6
DC640443  71F992B1  DD670950  74FE99BC  DE6A0E5D  7803A0C7
DF6D136A  7B08A7D2  E0701877  7E0DAEDD  E1731D84  8112B5E8
E2762291  8417BCF3  E379279E  871CC3FE  E47C2CAB  8A21CB09
E57F31B8  8D26D214  E68236C5  902BD91F  E7853BD2  9330E02A
E88840DF  9635E735  E98B45EC  993AEE40  EA8E4AF9  9C3FF54B
EB915006  9F44FC56  EC945513  A24A0361  ED975A20  A54F0A6C
EE9A5F2D  A8541177  EF9D643A  AB591882  F0A06947  AE5E1F8D
F1A36E54  B1632698  F2A67361  B4682DA3  F3A9786E  B76D34AE
F4AC7D7B  BA723BB9  F5AF8288  BD7742C4  F6B28795  C07C49CF
F7B58CA2  C38150DA  F8B891AF  C68657E5  F9BB96BC  C98B5EF0
FABE9BC9  CC9065FB  FBC1A0D6  CF956D06  FCC4A5E3  D29A7411
FDC7AAF0  D59F7B1C  FECAAFFD  D8A48227  FFCDB50A  DBA98932
00D0BA17  DEAE903D  01D3BF24  E1B39748  02D6C431  E4B89E53
03D9C93E  E7BDA55E  04DCCE4B  EAC2AC69  05DFD358  EDC7B374
06E2D865  F0CCBA7F  07E5DD72  F3D1C18A  08E8E27F  F6D6C895
09EBE78C  F9DBCFA0  0AEEEC99  FCE0D6AB  0BF1F1A6  FFE5DDB6
0CF4F6B3  02EAE4C1  0DF7FBC0  05EFEBCC  0EFB00CD  08F4F2D7
0FFE05DA  0BF9F9E2  11010AE7  0EFF00ED  12040FF4  120407F8
13071501  15090F03  140A1A0E  180E160E  150D1F1B  1B131D19
16102428  1E182424  17132935  211D2B2F  18162E42  2422323A
1919334F  27273945  1A1C385C  2A2C4050  1B1F3D69  2D31475B
1C224276  30364E66  1D254783  333B5571  1E284C90  36405C7C
1F2B519D  39456387  202E56AA  3C4A6A92  21315BB7  3F4F719D
223460C4  425478A8  233765D1  45597FB3  243A6ADE  485E86BE
253D6FEB  4B638DC9  264074F8  4E6894D4  27437A05  516D9BDF
28467F12  5472A2EA  2949841F  5777A9F5  2A4C892C  5A7CB100
2B4F8E39  5D81B80B  2C529346  6086BF16  2D559853  638BC621
2E589D60  6690CD2C  2F5BA26D  6995D437  305EA77A  6C9ADB42
3161AC87  6F9FE24D  3264B194  72A4E958  3367B6A1  75A9F063
346ABBAE  78AEF76E  356DC0BB  7BB3FE79  3670C5C8  7EB90584
3773CAD5  81BE0C8F  3876CFE2  84C3139A  3979D4EF  87C81AA5
3A7CD9FC  8ACD21B0  3B7FDF09  8DD228BB  3C82E416  90D72FC6
3D85E923  93DC36D1  3E88EE30  96E13DDC  3F8BF33D  99E644E7
408EF84A  9CEB4BF2  4191FD57  9FF052FD  42950264  A2F55A08
43980771  A5FA6113  449B0C7E  A8FF681E  459E118B  AC046F29
46A11698  AF097634  47A41BA5  B20E7D3F  48A720B2  B513844A
49AA25BF  B8188B55  4AAD2ACC  BB1D9260  4BB02FD9  BE22996B
4CB334E6  C127A076  4DB639F3  C42CA781  4EB93F00  C731AE8C
4FBC440D  CA36B597  50BF491A  CD3BBCA2  51C24E27  D040C3AD
52C55334  D345CAB8  53C85841  D64AD1C3  54CB5D4E  D94FD8CE
55CE625B  DC54DFD9  56D16768  DF59E6E4  57D46C75  E25EEDEF
58D77182  E563F4FA  59DA768F  E868FC05  5ADD7B9C  EB6E0310
5BE080A9  EE730A1B  5CE385B6  F1781126  5DE68AC3  F47D1831
5EE98FD0  F7821F3C  5FEC94DD  FA872647  60EF99EA  FD8C2D52
61F29EF7  0091345D  62F5A404  03963B68  63F8A911  069B4273
64FBAE1E  09A0497E  65FEB32B  0CA55089  6701B838  0FAA5794
6804BD45  12AF5E9F  6907C252  15B465AA  6A0AC75F  18B96CB5
6B0DCC6C  1BBE73C0  6C10D179  1EC37ACB  6D13D686  21C881D6
6E16DB93  24CD88E1  6F19E0A0  27D28FEC  701CE5AD  2AD796F7
```

FIG. 3d

| | | | | | |
|---|---|---|---|---|---|
| 711FEABA | 2DDC9E02 | 7222EFC7 | 30E1A50D | 7325F4D4 | 33E6AC18 |
| 7428F9E1 | 36EBB323 | 752BFEEE | 39F0BA2E | 762F03FB | 3CF5C139 |
| 77320908 | 3FFAC844 | 78350E15 | 42FFCF4F | 79381322 | 4604D65A |
| 7A3B182F | 4909DD65 | 7B3E1D3C | 4C0EE470 | 7C412249 | 4F13EB7B |
| 7D442756 | 5218F286 | 7E472C63 | 551DF991 | 7F4A3170 | 5823009C |
| 804D367D | 5B2807A7 | 81503B8A | 5E2D0EB2 | 82534097 | 613215BD |
| 835645A4 | 64371CC8 | 84594AB1 | 673C23D3 | 855C4FBE | 6A412ADE |
| 865F54CB | 6D4631E9 | 876259D8 | 704B38F4 | 88655EE5 | 73503FFF |
| 896863F2 | 7655470A | 8A6B68FF | 795A4E15 | 8B6E6E0C | 7C5F5520 |
| 8C717319 | 7F645C2B | 8D747826 | 82696336 | 8E777D33 | 856E6A41 |
| 8F7A8240 | 8873714C | 907D874D | 8B787857 | 91808C5A | 8E7D7F62 |
| 92839167 | 9182866D | 93869674 | 94878D78 | 94899B81 | 978C9483 |
| 958CA08E | 9A919B8E | 968FA59B | 9D96A299 | 9792AAA8 | A09BA9A4 |
| 9895AFB5 | A3A0B0AF | 9998B4C2 | A6A5B7BA | 9A9BB9CF | A9AABEC5 |
| 9B9EBEDC | ACAFC5D0 | 9CA1C3E9 | AFB4CCDB | 9DA4C8F6 | B2B9D3E6 |
| 9EA7CE03 | B5BEDAF1 | 9FAAD310 | B8C3E1FC | A0ADD81D | BBC8E907 |
| A1B0DD2A | BECDF012 | A2B3E237 | C1D2F71D | A3B6E744 | C4D7FE28 |
| A4B9EC51 | C7DD0533 | A5BCF15E | CAE20C3E | A6BFF66B | CDE71349 |
| A7C2FB78 | D0EC1A54 | A8C60085 | D3F1215F | A9C90592 | D6F6286A |
| AACC0A9F | D9FB2F75 | ABCF0FAC | DD003680 | ACD214B9 | E0053D8B |
| ADD519C6 | E30A4496 | AED81ED3 | E60F4BA1 | AFDB23E0 | E91452AC |
| B0DE28ED | EC1959B7 | B1E12DFA | EF1E60C2 | B2E43307 | F22367CD |
| B3E73814 | F5286ED8 | B4EA3D21 | F82D75E3 | B5ED422E | FB327CEE |
| B6F0473B | FE3783F9 | B7F34C48 | 013C8B04 | B8F65155 | 0441920F |
| B9F95662 | 0746991A | BAFC5B6F | 0A4BA025 | BBFF607C | 0D50A730 |
| BD026589 | 1055AE3B | BE056A96 | 135AB546 | BF086FA3 | 165FBC51 |
| C00B74B0 | 1964C35C | C10E79BD | 1C69CA67 | C2117ECA | 1F6ED172 |
| C31483D7 | 2273D87D | C41788E4 | 2578DF88 | C51A8DF1 | 287DE693 |
| C61D92FE | 2B82ED9E | C720980B | 2E87F4A9 | C8239D18 | 318CFBB4 |
| C926A225 | 349202BF | CA29A732 | 379709CA | CB2CAC3F | 3A9C10D5 |
| CC2FB14C | 3DA117E0 | CD32B659 | 40A61EEB | CE35BB66 | 43AB25F6 |
| CF38C073 | 46B02D01 | D03BC580 | 49B5340C | D13ECA8D | 4CBA3B17 |
| D241CF9A | 4FBF4222 | D344D4A7 | 52C4492D | D447D9B4 | 55C95038 |
| D54ADEC1 | 58CE5743 | D64DE3CE | 5BD35E4E | D750E8DB | 5ED86559 |
| D853EDE8 | 61DD6C64 | D956F2F5 | 64E2736F | DA59F802 | 67E77A7A |
| DB5CFD0F | 6AEC8185 | DC60021C | 6DF18890 | DD630729 | 70F68F9B |
| DE660C36 | 73FB96A6 | DF691143 | 77009DB1 | E06C1650 | 7A05A4BC |
| E16F1B5D | 7D0AABC7 | E272206A | 800FB2D2 | E3752577 | 8314B9DD |
| E4782A84 | 8619C0E8 | E57B2F91 | 891EC7F3 | E67E349E | 8C23CEFE |
| E78139AB | 8F28D609 | E8843EB8 | 922DDD14 | E98743C5 | 9532E41F |
| EA8A48D2 | 9837EB2A | EB8D4DDF | 9B3CF235 | EC9052EC | 9E41F940 |
| ED9357F9 | A147004B | EE965D06 | A44C0756 | EF996213 | A7510E61 |
| F09C6720 | AA56156C | F19F6C2D | AD5B1C77 | F2A2713A | B0602382 |
| F3A57647 | B3652A8D | F4A87B54 | B66A3198 | F5AB8061 | B96F38A3 |
| F6AE856E | BC743FAE | F7B18A7B | BF7946B9 | F8B48F88 | C27E4DC4 |
| F9B79495 | C58354CF | FABA99A2 | C8885BDA | FBBD9EAF | CB8D62E5 |
| FCC0A3BC | CE9269F0 | FDC3A8C9 | D19770FB | FEC6ADD6 | D49C7806 |
| FFC9B2E3 | D7A17F11 | 00CCB7F0 | DAA6861C | 01CFBCFD | DDAB8D27 |
| 02D2C20A | E0B09432 | 03D5C717 | E3B59B3D | 04D8CC24 | E6BAA248 |
| 05DBD131 | E9BFA953 | 06DED63E | ECC4B05E | 07E1DB4B | EFC9B769 |
| 08E4E058 | F2CEBE74 | 09E7E565 | F5D3C57F | 0AEAEA72 | F8D8CC8A |
| 0BEDEF7F | FBDDD395 | 0CF0F48C | FEE2DAA0 | 0DF3F999 | 01E7E1AB |

FIG. 3e

```
0EF6FEA6  04ECE8B6  0FFA03B3  07F1EFC1  10FD08C0  0AF6F6CC
12000DCD  0DFBFDD7  130312DA  110104E2  140617E7  14060BED
15091CF4  170B12F8  160C2201  1A101A03  170F270E  1D15210E
18122C1B  201A2819  19153128  231F2F24  1A183635  2624362F
1B1B3B42  29293D3A  1C1E404F  2C2E4445  1D21455C  2F334B50
1E244A69  3238525B  1F274F76  353D5966  202A5483  38426071
212D5990  3B47677C  22305E9D  3E4C6E87  233363AA  41517592
243668B7  44567C9D  25396DC4  475B83A8  263C72D1  4A608AB3
273F77DE  4D6591BE  28427CEB  506A98C9  294581F8  536F9FD4
2A488705  5674A6DF  2B4B8C12  5979ADEA  2C4E911F  5C7EB4F5
2D51962C  5F83BC00  2E549B39  6288C30B  2F57A046  658DCA16
305AA553  6892D121  315DAA60  6B97D82C  3260AF6D  6E9CDF37
3363B47A  71A1E642  3466B987  74A6ED4D  3569BE94  77ABF458
366CC3A1  7AB0FB63  376FC8AE  7DB6026E  3872CDBB  80BB0979
3975D2C8  83C01084  3A78D7D5  86C5178F  3B7BDCE2  89CA1E9A
3C7EE1EF  8CCF25A5  3D81E6FC  8FD42CB0  3E84EC09  92D933BB
3F87F116  95DE3AC6  408AF623  98E341D1  418DFB30  9BE848DC
4291003D  9EED4FE7  4394054A  A1F256F2  44970A57  A4F75DFD
459A0F64  A7FC6508  469D1471  AB016C13  47A0197E  AE06731E
48A31E8B  B10B7A29  49A62398  B4108134  4AA928A5  B715883F
4BAC2DB2  BA1A8F4A  4CAF32BF  BD1F9655  4DB237CC  C0249D60
4EB53CD9  C329A46B  4FB841E6  C62EAB76  50BB46F3  C933B281
51BE4C00  CC38B98C  52C1510D  CF3DC097  53C4561A  D242C7A2
54C75B27  D547CEAD  55CA6034  D84CD5B8  56CD6541  DB51DCC3
57D06A4E  DE56E3CE  58D36F5B  E15BEAD9  59D67468  E460F1E4
5AD97975  E765F8EF  5BDC7E82  EA6AFFFA  5CDF838F  ED700705
5DE2889C  F0750E10  5EE58DA9  F37A151B  5FE892B6  F67F1C26
60EB97C3  F9842331  61EE9CD0  FC892A3C  62F1A1DD  FF8E3147
63F4A6EA  02933852  64F7ABF7  05983F5D  65FAB104  089D4668
66FDB611  0BA24D73  6800BB1E  0EA7547E  6903C02B  11AC5B89
6A06C538  14B16294  6B09CA45  17B6699F  6C0CCF52  1ABB70AA
6D0FD45F  1DC077B5  6E12D96C  20C57EC0  6F15DE79  23CA85CB
7018E386  26CF8CD6  711BE893  29D493E1  721EEDA0  2CD99AEC
7321F2AD  2FDEA1F7  7424F7BA  32E3A902  7527FCC7  35E8B00D
762B01D4  38EDB718  772E06E1  3BF2BE23  78310BEE  3EF7C52E
793410FB  41FCCC39  7A371608  4501D344  7B3A1B15  4806DA4F
7C3D2022  4B0BE15A  7D40252F  4E10E865  7E432A3C  5115EF70
7F462F49  541AF67B  80493456  571FFD86  814C3963  5A250491
824F3E70  5D2A0B9C  8352437D  602F12A7  8455488A  633419B2
85584D97  663920BD  865B52A4  693E27C8  875E57B1  6C432ED3
88615CBE  6F4835DE  896461CB  724D3CE9  8A6766D8  755243F4
8B6A6BE5  78574AFF  8C6D70F2  7B5C520A  8D7075FF  7E615915
8E737B0C  81666020  8F768019  846B672B  90798526  87706E36
917C8A33  8A757541  927F8F40  8D7A7C4C  9382944D  907F8357
9485995A  93848A62  95889E67  9689916D  968BA374  998E9878
978EA881  9C939F83  9891AD8E  9F98A68E  9994B29B  A29DAD99
9A97B7A8  A5A2B4A4  9B9ABCB5  A8A7BBAF  9C9DC1C2  ABACC2BA
9DA0C6CF  AEB1C9C5  9EA3CBDC  B1B6D0D0  9FA6D0E9  B4BBD7DB
A0A9D5F6  B7C0DEE6  A1ACDB03  BAC5E5F1  A2AFE010  BDCAECFC
A3B2E51D  C0CFF407  A4B5EA2A  C3D4FB12  A5B8EF37  C6DA021D
A6BBF444  C9DF0928  A7BEF951  CCE41033  A8C1FE5E  CFE9173E
A9C5036B  D2EE1E49  AAC80878  D5F32554  ABCB0D85  D8F82C5F
```

FIG. 3f

```
ACCE1292  DBFD336A  ADD1179F  DF023A75  AED41CAC  E2074180
AFD721B9  E50C488B  B0DA26C6  E8114F96  B1DD2BD3  EB1656A1
B2E030E0  EE1B5DAC  B3E335ED  F12064B7  B4E63AFA  F4256BC2
B5E94007  F72A72CD  B6EC4514  FA2F79D8  B7EF4A21  FD3480E3
B8F24F2E  003987EE  B9F5543B  033E8EF9  BAF85948  06439604
BBFB5E55  09489D0F  BCFE6362  0C4DA41A  BE01686F  0F52AB25
BF046D7C  1257B230  C0077289  155CB93B  C10A7796  1861C046
C20D7CA3  1B66C751  C31081B0  1E6BCE5C  C41386BD  2170D567
C5168BCA  2475DC72  C61990D7  277AE37D  C71C95E4  2A7FEA88
C81F9AF1  2D84F193  C9229FFE  3089F89E  CA25A50B  338EFFA9
CB28AA18  369406B4  CC2BAF25  39990DBF  CD2EB432  3C9E14CA
CE31B93F  3FA31BD5  CF34BE4C  42A822E0  D037C359  45AD29EB
D13AC866  48B230F6  D23DCD73  4BB73801  D340D280  4EBC3F0C
D443D78D  51C14617  D546DC9A  54C64D22  D649E1A7  57CB542D
D74CE6B4  5AD05B38  D84FEBC1  5DD56243  D952F0CE  60DA694E
DA55F5DB  63DF7059  DB58FAE8  66E47764  DC5BFFF5  69E97E6F
DD5F0502  6CEE857A  DE620A0F  6FF38C85  DF650F1C  72F89390
E0681429  75FD9A9B  E16B1936  7902A1A6  E26E1E43  7C07A8B1
E3712350  7F0CAFBC  E474285D  8211B6C7  E5772D6A  8516BDD2
E67A3277  881BC4DD  E77D3784  8B20CBE8  E8803C91  8E25D2F3
E983419E  912AD9FE  EA8646AB  942FE109  EB894BB8  9734E814
EC8C50C5  9A39EF1F  ED8F55D2  9D3EF62A  EE925ADF  A043FD35
EF955FEC  A3490440  F09864F9  A64E0B4B  F19B6A06  A9531256
F29E6F13  AC581961  F3A17420  AF5D206C  F4A4792D  B2622777
F5A77E3A  B5672E82  F6AA8347  B86C358D  F7AD8854  BB713C98
F8B08D61  BE7643A3  F9B3926E  C17B4AAE  FAB6977B  C48051B9
FBB99C88  C78558C4  FCBCA195  CA8A5FCF  FDBFA6A2  CD8F66DA
FEC2ABAF  D0946DE5  FFC5B0BC  D39974F0  00C8B5C9  D69E7BFB
01CBBAD6  D9A38306  02CEBFE3  DCA88A11  03D1C4F0  DFAD911C
04D4C9FD  E2B29827  05D7CF0A  E5B79F32  06DAD417  E8BCA63D
07DDD924  EBC1AD48  08E0DE31  EEC6B453  09E3E33E  F1CBBB5E
0AE6E84B  F4D0C269  0BE9ED58  F7D5C974  0CECF265  FADAD07F
0DEFF772  FDDFD78A  0EF2FC7F  00E4DE95  0FF6018C  03E9E5A0
10F90699  06EEECAB  11FC0BA6  09F3F3B6  12FF10B3  0CF8FAC1
140215C0  0FFE01CC  15051ACD  130308D7  16081FDA  16080FE2
170B24E7  190D16ED  180E29F4  1C121DF8  19112F01  1F172503
```

(above are first 32 bytes)

15152369  2323315B  16182876  26283866  171B2D83  292D3F71
181E3290  2C32467C  1921379D  2F374D87  1A243CAA  323C5492

1B2741B7  35415B9D  1C2A46C4  384662A8  1D2D4BD1  3B4B69B3
1E3050DE  3E5070BE  1F3355EB  415577C9  20365AF8  445A7ED4
21396005  475F85DF  223C6512  4A648CEA  233F6A1F  4D6993F5
24426F2C  506E9B00  25457439  5373A20B  26487946  5678A916

(above are bytes 33-64)
```

```
274B7E53  597DB021  284E8360  5C82B72C  2951886D  5F87BE37
2A548D7A  628CC542  2B579287  6591CC4D  2C5A9794  6896D358

(above are bytes 129-160)

2D5D9CA1  6B9BDA63  2E60A1AE  6EA0E16E  2F63A6BB  71A5E879
3066ABC8  74AAEF84  3169B0D5  77AFF68F  326CB5E2  7AB4FD9A
336FBAEF  7DBA04A5  3472BFFC  80BF0BB0  3575C509  83C412BB
3678CA16  86C919C6  377BCF23  89CE20D1  387ED430  8CD327DC
3981D93D  8FD82EE7  3A84DE4A  92DD35F2  3B87E357  95E23CFD
3C8AE864  98E74408  3D8DED71  9BEC4B13  3E90F27E  9EF1521E
```

```
0F03051B 11050719 10060A28 140A0E24 11090F35 170F152F
120C1442 1A141C3A 130F194F 1D192345 14121E5C 201E2A50
Above were the first 32 bytes and still at same offset 00000000 00000000 00000000 00000000 00000000 00000000
00000000 00000000 00000000 00000000 00000000 00000000
00000000 00000000 00000000 00000000 00000000 00000000
00000000 00000000 00000000 00000000 00000000 00000000
00000000 00000000 00000000 00000000 00000000 00000000
00000000 00000000 00000000 00000000 00000000 00000000

15152369 2323315B 16182876 26283866 171B2D83 292D3F71
181E3290 2C32467C 1921379D 2F374D87 1A243CAA 323C5492
Above were bytes 33-64 but now at offset of 129-160

Above were the first 32 bytes but still at same offset 41424344  41424344  41424344  41424344  41424344  41424344
41424344  41424344  41424344  41424344  41424344  41424344
41424344  41424344  41424344  41424344  41424344  41424344
41424344  41424344  41424344  41424344  41424344  41424344
41424344  41424344  41424344  41424344  41424344  41424344
41424344  41424344  41424344  41424344  41424344  41424344

15152369  2323315B  16182876  26283866  171B2D83  292D3F71
181E3290  2C32467C  1921379D  2F374D87  1A243CAA  323C5492

Above were bytes 33-64 but now at different offset of 129-160

Above were first 32 bytes and still at the same offset 41424344 41424344 41424344 41424344 41424344 41424344
41424344 41424344 41424344 41424344 41424344 41424344
41424344 41424344 41424344 41424344 41424344 41424344
41424344 41424344 41424344 41424344 41424344 41424344
41424344 41424344 41424344 41424344 41424344 41424344
41424344 41424344 41424344 41424344 41424344 41424344
```
⎫
⎬ 402c
⎭

```
274B7E53 597DB021 284E8360 5C82B72C 2951886D 5F87BE37
2A548D7A 628CC542 2B579287 6591CC4D 2C5A9794 6896D358

Above were bytes 129-160 and still at the same offset 45464748 45464748 45464748 45464748 45464748 45464748
45464748 45464748 45464748 45464748 45464748 45464748
45464748 45464748 45464748 45464748 45464748 45464748
45464748 45464748 45464748 45464748 45464748 45464748
45464748 45464748 45464748 45464748 45464748 45464748
45464748 45464748 45464748 45464748 45464748 45464748
```
⎫
⎬ 404c
⎭

FIG. 4d ural
GENERATING A DATA STREAM WITH CONFIGURABLE COMPRESSION

RELATED APPLICATIONS

This application is related to: U.S. Pat. No. 10,038,733 (Ser. No. 14/489,317, filed Sep. 17, 2014), entitled GENERATING A LARGE, NON-COMPRESSIBLE DATA STREAM, issued Jul. 31, 2018; U.S. Pat. No. 10,114,832 (Ser. No. 14/489,363, filed Sep. 17, 2014), entitled GENERATING A DATA STREAM WITH A PREDICTABLE CHANGE RATE, issued Oct. 30, 2018; and, U.S. Pat. No. 10,114,850 (Ser. No. 14/489,295, filed Sep. 17, 2014), entitled DATA STREAM GENERATION USING PRIME NUMBERS, issued Oct. 30, 2018. This application is also related to: United States patent application (Ser. No. 16/389, 729), entitled GENERATING A DATA STREAM WITH CONFIGURABLE CHANGE RATE AND CLUSTERING CAPABILITY, filed the same day herewith; United States patent application (Ser. No. 16/389,700), entitled GENERATING A DATA STREAM WITH CONFIGURABLE COMMONALITY, filed the same day herewith; United States patent application (Ser. No. 16/389,741), entitled GENERATING AND MORPHING A COLLECTION OF FILES IN A FOLDER/SUB-FOLDER STRUCTURE THAT COLLECTIVELY HAS DESIRED DEDUPABILITY, COMPRESSION, CLUSTERING AND COMMONALITY, filed the same day herewith; U.S. Pat. No. 10,163, 371, (Ser. No. 15/420,633, filed Jan. 31, 2017), entitled ROTATING BIT VALUES BASED ON A DATA STRUCTURE WHILE GENERATING A LARGE, NON-COMPRESSIBLE DATA STREAM, issued Dec. 25, 2018; and, U.S. Pat. No. 10,235,134 (Ser. No. 15/420,614, filed Jan. 31, 2017), entitled ROTATING BIT VALUES WHILE GENERATING A LARGE, NON-COMPRESSIBLE DATA STREAM, issued Mar. 19, 2019. All of the aforementioned patents and applications are incorporated herein in their respective entireties by this reference.

FIELD OF THE INVENTION

Embodiments of the present invention generally relate to generation of data streams having various attributes. More particularly, at least some embodiments of the invention relate to systems, hardware, software, computer-readable media, and methods for generating data streams whose compression is configurable.

BACKGROUND

Developers and other personnel often have a need to simulate characteristics of real world data streams that are generated by applications that are in a developmental stage. Simulation of real world data stream characteristics, such as compressibility for example, enables the developer to identify and correct any problems, and enhance performance of the application, before the application, or a revision of the application, is rolled out.

Various algorithms have been developed for generation of data streams. However data streams generated by these algorithms may be relatively narrow in terms of their applicability and usefulness. This may be due to various factors. For example, the speed with which such streams are generated may not be adequate. As another example, data streams generated by such algorithms may be incompressible. Further, such data streams may not be deduplicatable. These, and other, factors may tend to limit the effectiveness, in some applications, of the data streams produced by some data stream generation algorithms.

BRIEF DESCRIPTION OF THE DRAWINGS

In order to describe the manner in which at least some of the advantages and features of the invention can be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

FIGS. 3a-3g disclose an example portion of an incompressible data stream.

FIGS. 4a-4d disclose examples of ways in which multiple data streams can be combined to create an output data stream having a particular compressibility.

DETAILED DESCRIPTION OF SOME EXAMPLE EMBODIMENTS

Figure 1:
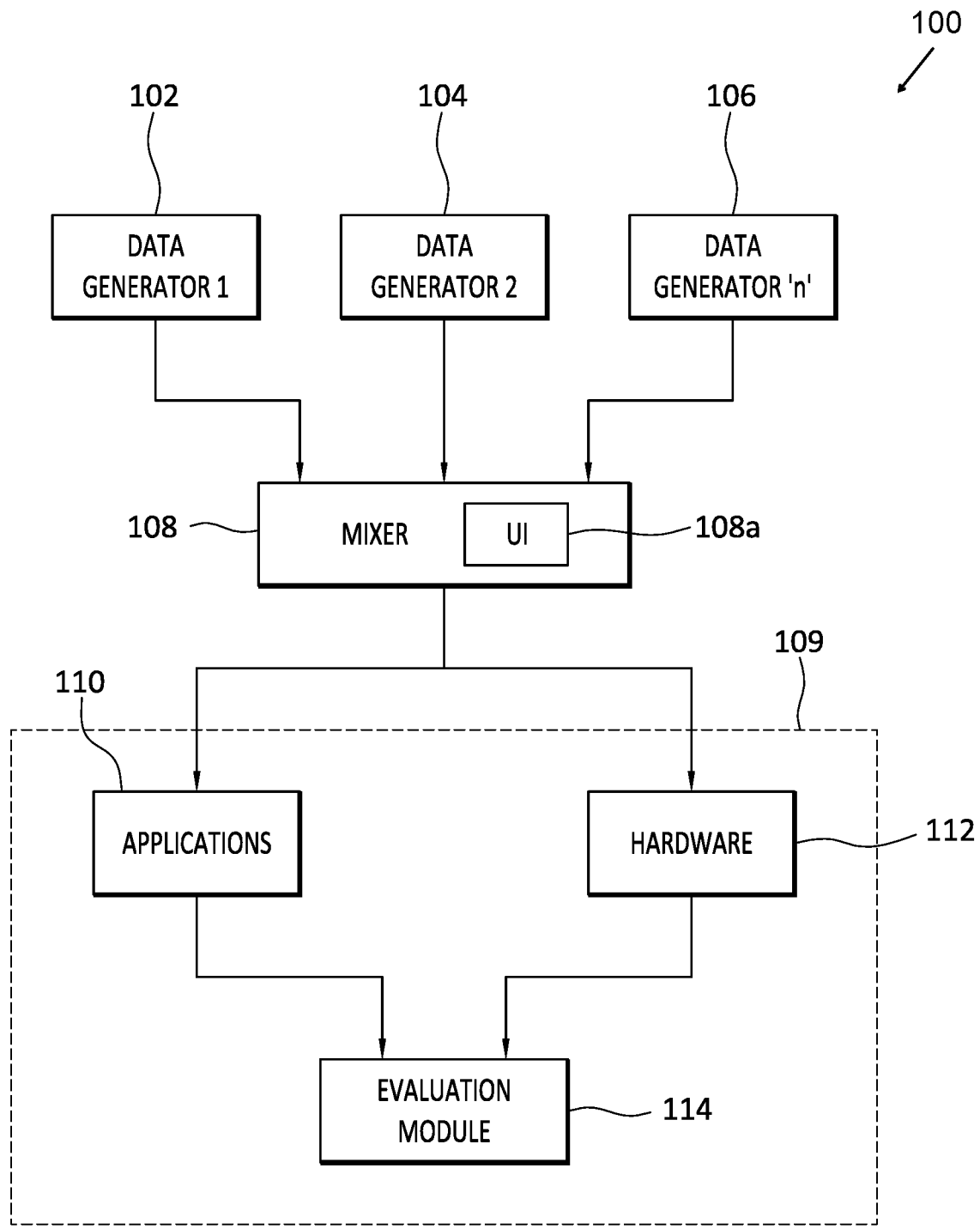
FIG. 1 discloses aspects of an example operating environment for some embodiments of the invention.

Embodiments of the present invention generally relate to generation of data streams having various attributes. More particularly, at least some embodiments of the invention relate to systems, hardware, software, computer-readable media, and methods for generating data streams whose compression is configurable. The data in a given data stream may be referred to herein as a dataset.

More particularly, example embodiments of the invention employ data stream mixing to generate a data stream having particular compression properties. Depending upon the implementation, two, or more, data streams may be mixed. The resulting data stream created by the mixing of two or more data streams may be used in a variety of applications. To illustrate, such a resulting, or synthesized, data stream may be used in applications where high speed generation of a data stream, having particular compression properties, is needed for automated and/or manual testing of an application, hardware, and/or other elements. Example data streams may be generated at rates exceeding 1 GBPS. In at least some embodiments, compressible streams, and incompressible data streams, can be generated by the methods and systems disclosed in one or more of the Related Applications.

One of the data streams that is to be mixed with one or more other data streams may have a compressibility of about 0%, although that is not required. Examples of such data streams, and methods for generating them, are disclosed in one or more of the Related Applications noted herein. Additionally, or alternatively, one of the data streams that is to be mixed with one or more other data streams may have a compressibility of about 100%, although that is not required.

In some embodiments, multiple data streams are mixed together to generate a new data stream having a particular compressibility. Where any two or more data streams are mixed together, the respective data of the data streams may be interleaved, such as on a data block, data sequence, or other, basis, to form the new data stream. Finally, the data streams can be mixed in a variety of ways, such as clustered, uniform, random, or normalized mixing.

Advantageously then, embodiments of the invention may provide various benefits and improvements relative to the configuration and operation of conventional hardware, software, systems and methods. For example, an embodiment of the invention enables customization of a data stream to meet testing, analytical, and diagnostic needs in a computing environment. As well, an embodiment of the invention enables generation of a data stream having a particular, 'non-zero,' compressibility. Further, an embodiment of the invention enables generation of data stream having a particular commonality with respect to respective data streams generated by computing entities in a population of computing entities. The compressibility feature helps to simulate data that is partly compressible, which is a common data type in many applications. The commonality feature helps to simulate data that is common across multiple groups of owners. This is useful in the context of deduplication engines and processes, which need to be both effective and efficient in their deduplication operations. Moreover, the flexibility of embodiments of the invention enable generation of data streams specifically suited for performance of customized testing, analytical, and diagnostic, processes in a computing environment. Among other things, such embodiments enable the identification of areas where improvements may be made in the operation of an application and/or computing system hardware and other software.

It should be noted that the foregoing advantageous aspects of various embodiments are presented only by way of example, and various other advantageous aspects of example embodiments of the invention will be apparent from this disclosure. It is further noted that it is not necessary that any embodiment implement or enable any of such advantageous aspects disclosed herein.

A. Aspects of an Example Operating Environment

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, data generation and data management operations. Such data management operations may include, but are not limited to, data read/write/delete operations, data deduplication operations, data backup operations, data restore operations, data cloning operations, data archiving operations, and disaster recovery operations. Thus, while the discussion herein may, in some aspects, be directed to a discussion of data protection environments and operations, the scope of the invention is not so limited. More generally then, the scope of the invention embraces any operating environment in which the disclosed concepts may be useful. In some instances, embodiments of the invention generate data streams for use in testing systems and applications in various environments, one example of which is a data protection environment.

A data protection environment, for example, may take the form of a public or private cloud storage environment, an on-premises storage environment, and hybrid storage environments that include public and private elements, although the scope of the invention extends to any other type of data protection environment as well. Any of these example storage environments, may be partly, or completely, virtualized. The storage environment may comprise, or consist of, a datacenter which is operable to service read and write operations initiated by one or more clients.

In addition to the storage environment, the operating environment may also include one or more host devices, such as clients for example, that each host one or more applications. As such, a particular client may employ, or otherwise be associated with, one or more instances of each of one or more applications that generate data that is desired to be protected. In general, the applications employed by the clients are not limited to any particular functionality or type of functionality. Some example applications and data include email applications such as MS Exchange, filesystems, as well as databases such as Oracle databases, and SQL Server databases. The applications on the clients may generate new and/or modified data that is desired to be protected.

Any of the devices, including the clients, servers and hosts, in the operating environment can take the form of software, physical machines, or virtual machines (VM), or any combination of these, though no particular device implementation or configuration is required for any embodiment. Similarly, data protection system components such as databases, storage servers, storage volumes (LUNs), storage disks, replication services, backup servers, restore servers, backup clients, and restore clients, for example, can likewise take the form of software, physical machines or virtual machines (VM), though no particular component implementation is required for any embodiment. Where VMs are employed, a hypervisor or other virtual machine monitor (VMM) can be employed to create and control the VMs.

As used herein, the term 'data' is intended to be broad in scope. Thus, that term embraces, by way of example and not limitation, data segments such as may be produced by data stream segmentation processes, data chunks, data blocks, atomic data, emails, objects of any type, files, contacts, directories, sub-directories, volumes, and any group of one or more of the foregoing.

Example embodiments of the invention are applicable to any system capable of storing and handling various types of objects, in analog, digital, or other form. Although terms such as document, file, block, or object may be used by way of example, the principles of the disclosure are not limited to any particular form of representing and storing data or other information. Rather, such principles are equally applicable to any object capable of representing information.

With particular attention now to FIG. 1, one example of an operating environment is denoted generally at 100. In some embodiments, the operating environment may comprise, or consist of, a data protection environment. The operating environment can include an enterprise datacenter, or a cloud datacenter, or both. The data protection environment may support various data protection processes, including data replication, data deduplication, cloning, data backup, and data restoration, for example. As used herein, the term backups is intended to be construed broadly and includes, but is not limited to, partial backups, incremental backups, full backups, clones, snapshots, continuous replication, and any other type of copies of data, and any combination of the foregoing. Any of the foregoing may, or may not, be deduplicated.

In the illustrated example, the operating environment 100 may include any type and number of data generators 102, 104 and 106. In general, the data generators 102 . . . 106 may be any software, hardware, or combination of software and hardware, that is operable to generate data. The software may, in some embodiments, comprise, or consist of, one or more applications, and the applications may be of any type. Thus, in some cases, one or more of the data generators 102 . . . 106 may comprise a client device that hosts one or more applications. The data generated by a data generator may, or may not, be targeted for protection and backed up, such as at a cloud datacenter for example. In some embodiments, one, some, or all, of the data generators 102 . . . 106 may comprise a purpose-built entity, which may comprise hardware and/or software, specifically configured to generate incompressible data streams and/or compressible data streams.

As further indicated in FIG. 1, the operating environment 100 may include a mixer 108. In general, the mixer 108 is operable to combine data streams from the data generators 102 . . . 106 so as to create a new data stream. Each new data stream created by the mixer 108 can be generated in such a way as to have particular compression attributes.

The operation of the mixer 108 may be configurable via various parameters, and these parameters may help to shape the properties of the output data stream. These parameters of an output data stream created by the mixer 108 may be specified, for example, by a user using a user interface (UI) 108a and/or application program interface (API) associated with the mixer 108. The UI may be any type of user interface including, but not limited to, a graphical user interface (GUI), or a command line interface (CLI). The mixer 108 can then use the user input to generate a new data stream by mixing two or more input data streams. User inputs provided by way of the UI, and/or other mechanism, may include, but are not limited to, any one or more of: the amount of data of the output stream; one or more self seeds; one or more base seeds; the identity of the source data streams; the identity of the data generators; a desired commonality factor (CF); a respective compressibility parameter for each source data stream; and, a desired compressibility parameter for the data stream generated by the mixer 108. In an embodiment, the mixer 108 may combine multiple data streams from each of a plurality of respective sources, such as from the data generators 102 . . . 106 for example.

The mixer 108 may be implemented as hardware, software, or a combination of hardware and software. In some embodiments, the mixer 108 takes the form of an application that may be hosted on a server, or any other type of host device. The mixer 108 may reside at a user premises, at a cloud datacenter, and/or at any other site. In some embodiments, the mixer 108 may be an element of another system or device, such as a deduplication server for example. Thus, in such embodiments, an output data stream generated by the mixer 108 may then be deduplicated by the deduplication server. However, the mixer 108 need not be an element of a deduplication server and, in other embodiments, the output data stream generated by the mixer 108 may be provided to a deduplication server for deduplication.

With continued reference to FIG. 1, the mixer 108 may constitute an element of, or communicate with, a test environment 109. The test environment 109 may include, for example, one or more applications 110 and/or one or more hardware devices 112. In general, the data streams generated by the mixer 108 may be provided by the mixer 108 to an application 110 and/or hardware device 112 for testing, analysis, and/or diagnostic, operations. Such data streams may, or may not, be deduplicated before being provided to the test environment 109.

More particularly, the data streams generated by the mixer 108 may be provided to, and utilized by, an application 110 and/or hardware device 112. The outputs and/or other responses of the application 110 and/or hardware 112 can then be provided to an evaluation module 114 for analysis and diagnostics. In some embodiments, the evaluation module 114 is an element of the mixer 108. In other embodiments however, the evaluation module 114 is separate and distinct from the mixer 108.

By generating data streams using inputs from one or more data generators, the mixer 108 enables the testing of application 110 and/or hardware 112 so that analyses may be performed, and solutions identified for any problems observed. The flexibility of embodiments with respect to customizing the commonality and/or compressibility of data streams generated by the mixer 108 enables a wide variety of test and evaluation scenarios to mimic, or replicate, real world conditions.

B. Example Host and Server Configurations

Figure 2:
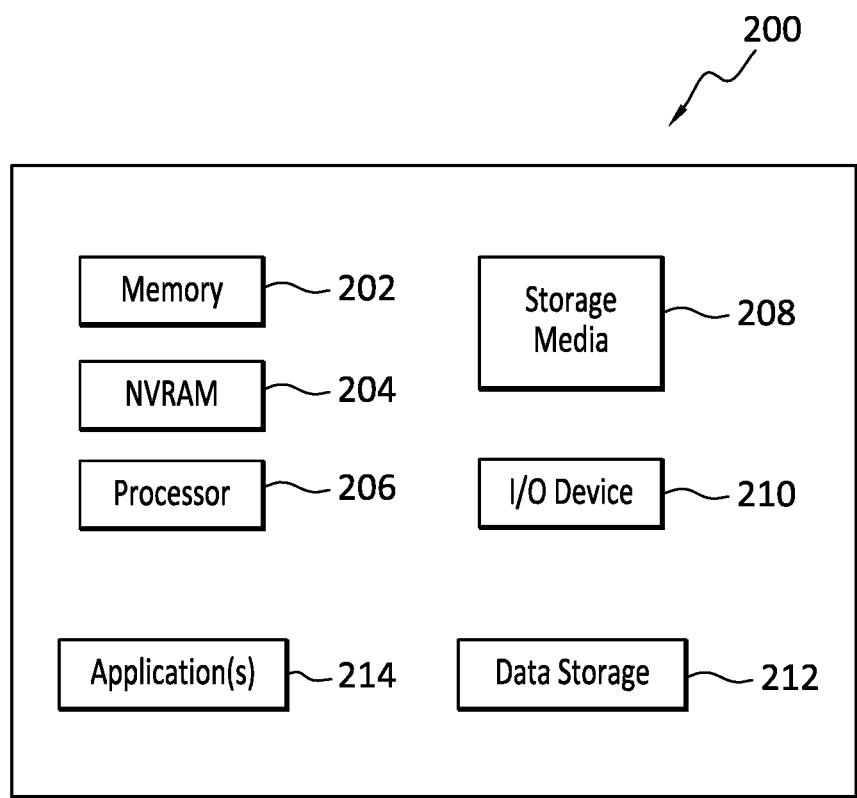
FIG. 2 discloses aspects of an example host configuration.

With reference briefly now to FIG. 2, any one or more of the data generators 102 . . . 106, mixer 108, test platform 109, applications 110, hardware 112, evaluation module 114, entity 306, and mixer 308, can take the form of, or include, or be implemented on, or hosted by, a physical computing device, one example of which is denoted at 200. As well, where any of the aforementioned elements comprise or consist of a virtual machine (VM), that VM may constitute a virtualization of any combination of the physical components disclosed in FIG. 2.

In the example of FIG. 2, the physical computing device 200 includes a memory 202 which can include one, some, or all, of random access memory (RAM), non-volatile random access memory (NVRAM) 204, read-only memory (ROM), and persistent memory, one or more hardware processors 206, non-transitory storage media 208, UI device 210, and data storage 212. One or more of the memory components 202 of the physical computing device 200 can take the form of solid state device (SSD) storage. As well, one or more applications 214 are provided that comprise executable instructions. Such executable instructions can take various forms including, for example, instructions executable to perform any method or portion thereof disclosed herein, and/or executable by/at any of a storage site, whether on-premises at an enterprise, or a cloud storage site, client, datacenter, backup server, blockchain network, or blockchain network node, to perform functions disclosed herein. As well, such instructions may be executable to perform any of the other operations disclosed herein including, but not limited to, data stream mixing, data stream evaluation and analysis, data stream generation, read, write, backup, and restore, operations and/or any other data protection operation, auditing operations, cloud service operations.

C. Modified Data Stream with Configurable Compression

Figure 3:
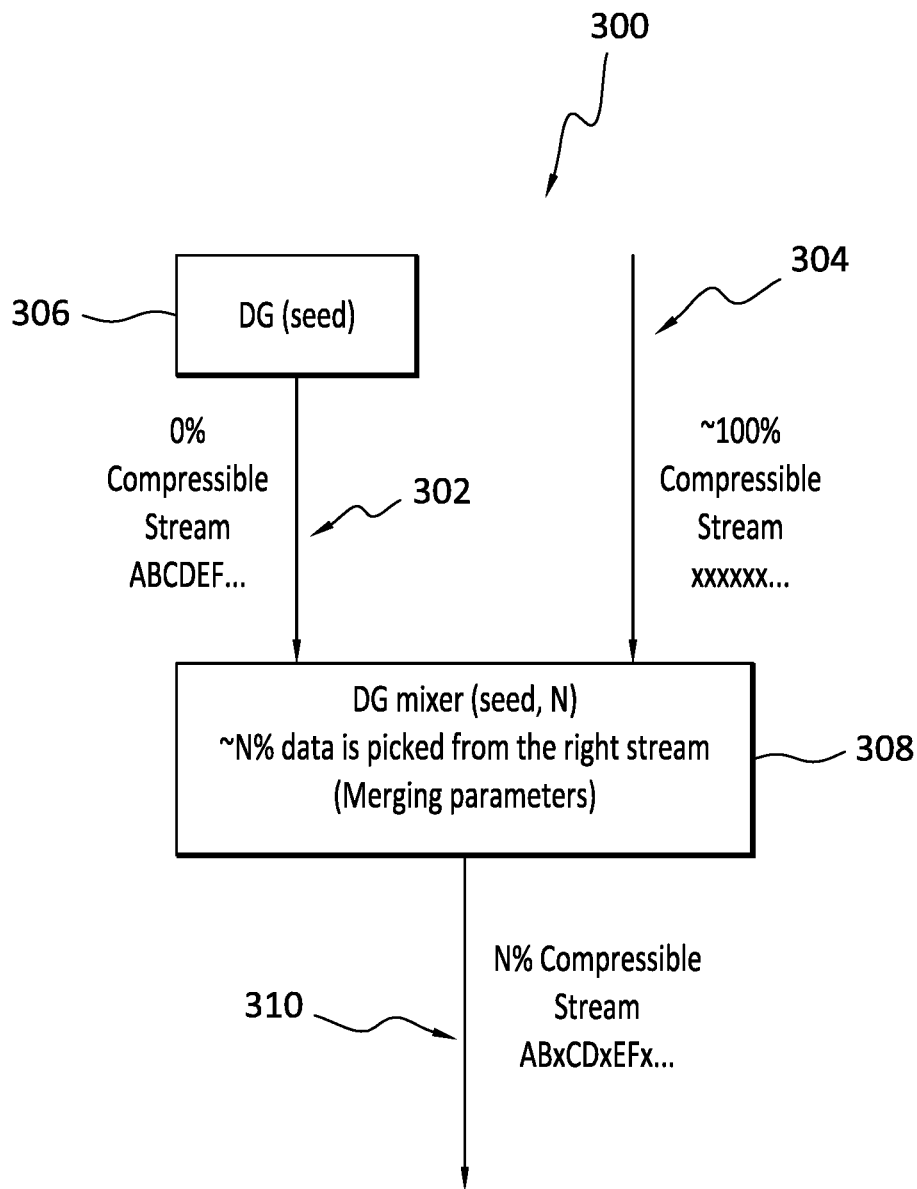
FIG. 3 discloses some general aspects of a configuration in which one or more incompressible data streams are mixed with one or more compressible data streams to generate a mixed data stream of a particular compressibility.

Directing attention now to FIG. 3, details are provided concerning systems and processes for generating data streams having a user-configurable compression. In the example 300 of FIG. 3, one or more incompressible data streams 302 are mixed together, or merged, with one or more compressible data streams 304. The data streams may be mixed together in a uniform, random, normalized, or clustered distribution, manner. The extent, if any, to which any particular input and/or output data stream, or data streams, is/are compressible, can be specified by a user or a computing entity. As well, the way, or ways, in which the two or more data streams are mixed together, can be specified by a user or a computing entity. It should be noted that the arrangement 300 disclosed in FIG. 3 is presented only by way of example, and it will be apparent to one having the benefit of this disclosure that the principles disclosed in relation to FIG. 3 are extendible to a variety of other circumstances and configurations as well.

In the particular example of FIG. 3, an incompressible data stream 302 may be generated, such as by a data generator, examples of which are disclosed herein. In some embodiments, the incompressible data stream 302 may be generated by an entity 306 specifically configured to generate incompressible data streams. As indicated, the incompressible data stream 302 may be generated based on an initialization parameter that may be referred to as a 'seed' or 'seed value.' Other example data generators are disclosed in the Related Applications.

The incompressible data stream 302 may be referred to as having a compressibility that is 0%, or about 0%. Thus, the incompressible data stream 302 may comprise, or consist of, a sequence of blocks that are each unique. To illustrate, the incompressible data stream 302 may include the sequence of blocks 'ABCDEF . . . ' As this example illustrates, there is, in the sequence, only a single instance of each block. Thus, the sequence ABCDEF of the data stream 302 cannot be compressed since there are no duplicate blocks that can be removed from the sequence to reduce, that is, compress, the size of the sequence. Examples of incompressible data streams, and processes for generating incompressible data streams, are disclosed in one or more of the Related Applications.

On the other hand, the data stream 304 may be partly, or fully, compressible. In the latter case, the data stream 304 may be referred to as having a compressibility that is 100%, or about 100%. Thus, the compressible data stream 304 may comprise, or consist of, a sequence of characters, parts, or other pieces of data, that are all the same. To illustrate, the compressible data stream 304 may include the sequence 'XXXXXX . . . ' As this example illustrates, there is, in this sequence, multiple instances of the same character. Thus, the sequence XXXXXX of the data stream 304 is highly compressible, though maybe not 100% compressible, since all the characters in the sequence are duplicates, and nearly all of the duplicate characters can be removed from the sequence to reduce, that is, compress, the size of the sequence. Further examples of data stream compression are discussed below at FIGS. 4a-4d.

In some embodiments, the data streams 302 and 304 may be produced by the same entity, such as an application hosted by a host device. In other embodiments, the data stream 302 may be generated by a purpose-built entity, which may comprise hardware and/or software, specifically configured to generate incompressible data streams, and the data stream 304 may be produced by a data generator such as is disclosed herein.

With continued reference to FIG. 3, the data streams 302 and 304 may be provided to a mixer 308 which may be similar, or identical, to the mixer 108 disclosed in FIG. 1. As such, the inputs (seed, N) to the mixer 308 are the seed that was used as a basis for generation of the incompressible data stream 302, and 'N,' or the percentage of data from the compressible data stream 304 that will be used in the generation of the output stream by the mixer 308. To illustrate with an example, a compressible data stream 310 generated by the mixer 308 may comprise 70% incompressible data from the data stream 302, and 30%, that is, 'N' %, data from the data stream 304. The combination, by the mixer 308, of these two data streams results in an output data stream 310 that is 30% compressible. That is, the output data stream 310 may be compressed to 70% of its initial size. As the foregoing example illustrates, the value of 'N' can be selected as necessary.

With continued reference to FIG. 3, a further example is illustrative. If 'N' is specified to be 33%, such as by a user using a UI in communication with the mixer 308, the data stream 310 generated by the mixer 308 is about 33% compressible. Thus, part of the data in an example output data stream 310 may be supplied by the data stream 302, and the other part of the data in an example output data stream 310 may be supplied by the data stream 304. More generally, any number 'X' of input data streams can be mixed together to generate an output data stream, where X is a whole integer 2. An example sequence of the output data stream 310 may include 9 blocks and look like 'ABXCDXEFX . . . ', where 6/9 of the blocks (that is, AB, CD, and EF), or about 67% of the data, are taken from the data stream 302, and 3/9 of the blocks (that is X, X, X), or about 33% of the data, are taken from the data stream 304.

D. Configurable Compressibility

The discussion thus far has addressed various concepts concerning the combination of two or more data streams, each having a respective compressibility in a range of about 0% to about 100%, to generate an output data stream with a desired compressibility. In general, a data stream of any degree of compressibility (in a range of about 0% to about 100%) can be generated in connection with embodiments of the invention. That data stream can be generated by mixing two or more data streams in any of a wide variety of different ways which are disclosed herein and/or which would be apparent from this disclosure. As such, the following illustrations of ways in which data streams of desired compressibility can be created are provided only by way of example, and not limitation.

With attention briefly to FIGS. 3a-3g, an example block 300 of data (approximately 8 KB in size) of an incompressible data sequence, is disclosed. The block 300, which can be generated by a data generator, begins on FIG. 3a and ends at the bottom of FIG. 3g. The portions of the block 300 denoted at 302 and 304 are each 128 byte examples that are used for illustrative purposes in the following discussion. In each of the examples of FIGS. 4a-4d, a mixed data stream can include compressible data such as can be provided by way of a data stream such as data stream 304 (FIG. 3), and the mixed data stream can include incompressible data such as can be provided by way of a data stream such as data stream 302 (FIG. 3).

With general reference now to FIGS. 4a-4d, details are provided concerning some specific examples of how multiple data streams can be combined to create an output data stream having a particular compressibility. The examples disclosed in FIGS. 4a-4d can be implemented, for example, by a mixer, embodiments of which are disclosed herein.

Turning next to FIG. 4a, it will be assumed for the purposes of discussion that the example block portions 302 and 304 (see FIG. 3a), which together comprise 256 bytes, represent respective 8 KB blocks 402 and 404. The example disclosed in FIG. 4b illustrates one way in which a desired level of compressibility can be achieved with respect to the example blocks 402 and 404. As is evident from the blocks 402 and 404, those blocks are incompressible because any sequence of bytes (where a sequence length is 1 or more) does not significantly occur again in those blocks. Thus, if the 256 byte data sequence shown in FIG. 4a were sent to a dedupe engine, the blocks 402 and 404 could not be compressed by the dedupe engine.

In the example of FIG. 4*b*, however, blocks 402*a* and 404*a* represent blocks 402 and 404 after a desired compressibility has been introduced. It is assumed for the purposes of illustration that the blocks 402*a* and 404*a*, when created, should have a compressibility of about 75%, that implementation of the desired compressibility takes place at the block level, and that the blocks are 8 KB in size. It is noted however, a user and/or computing entity, such as a dedupe engine, can specify one or more parameters such as, but not limited to: (i) the block size; (ii) the desired compressibility; and, (iii) the level, block or otherwise, at which compression should be performed. Additional, or alternative, parameters may be considered when compressibility is to be implemented in a data stream.

With continued reference to FIG. 4*b*, no change is made to the first 32 bytes of the block, and so those bytes remain at the same original offset. However, the remaining 96 bytes of block 402 are replaced with 00, where a 00 refers to a byte that has a value of 0 or in hexadecimals 0x00. The 00 values are located at bytes 33-128, which results in a block 402*b* having a compressibility of about 75%. Similarly with regard to block 404*a*, and in view of the insertion of 00 values at bytes 33-128, the original values at bytes 33-64 are now re-positioned at a different offset, that is, at bytes 129-160, followed by 00 values at the next 96 bytes. Thus, blocks 402*a* and 404*a* now each have a compressibility of about a 75%. It will be appreciated that the aforementioned process can be performed repeatedly until an entire data stream, or portion thereof, comprises, or consists of, blocks that are each compressible to the specified extent, 75% in this example.

Turning now to FIG. 4*c*, a variation of the processes concerning FIG. 4*b* is disclosed. In general, FIG. 4*c* discloses the notion that to achieve a desired compressibility at the block, or other level, the compressible portion of the block can be made up of any compressible data. Thus, as indicated in FIG. 4*c*, the compressible data need not be 00 values. In the example blocks 402*b* and 404*b*, the compressible data is 41424344 (ABCD) and 45464748 (EFGH), respectively. It can be seen that this data will compress as readily as if 00 values had been used, as in the example of FIG. 4*b*. It can also be seen that the compressible data used can, but is not required to, be different for different blocks of the same data stream. Thus, the compressible data for block 402*b* is 41424344, while the compressible data for block 404*b* is 45464748.

As well, and similar to the example of FIG. 4*b*, the offset of the first 32 bytes of block 402*b* is unchanged by the insertion of the compressible data 41424344. However, the original bytes 33-64 are still present, but now positioned at an offset of 129-160 as a result of the insertion of the compressible data 41424344.

In the examples of FIGS. 4*b* and 4*c*, compressible data, such as 00 values, or other compressible data such as U.S. Pat. No. 41,424,344 (ABCD) and 45464748 (EFGH), was inserted into the data blocks 402*a*, 404*a*, 402*b*, and 404*b*, so as to achieve the desired block level compressibility. In other embodiments, processes other than data insertion can be used to achieve a desired compressibility when generating a mixed data stream. Accordingly, attention is directed now to FIG. 4*d*, where blocks 402*c* and 404*c* are disclosed. In this example, compressible data is written over some of the incompressible data, rather than being inserted in the incompressible data, as in the examples of FIGS. 4*b* and 4*c*.

Thus, as indicated in the example of FIG. 4*d*, and with reference first to block 402*c*, compressible data is written over all bytes after the first 32 bytes. Similar to other examples disclosed herein, there is no change to the offset of the first 32 bytes. The effect of the overwrite can be seen more clearly with reference to block 404*c*. In block 404*c*, compressible data is written over some of the incompressible data, specifically, bytes 33-64. Thus, rather than bytes 33-128 being moved to an offset of 129-160, as occurred when compressible data was inserted (FIGS. 4*b* and 4*c*), those bytes 33-128 are overwritten in the example of FIG. 4*d*, and the data originally at bytes 129-160 thus remains at the 129-160 offset. Bytes 161-256 of block 404*c* are overwritten with compressible data.

E. Example Data Stream Mixing Methodologies

With the foregoing examples in view, it was noted herein that that when two or more data streams are mixed together, the mixing of the data in the two data streams can be performed in various ways. For example, the mixing may be uniform, clustered, random, normalized, or any other mathematical distribution or mix of one or more of these example distributions. The particular mixing process employed can be selected based on the particular circumstances involved. Some examples of these mixing processes are discussed below.

An understanding of some aspects of example mixing processes can be appreciated with reference to an example. Particularly, it is useful in at least some circumstances to keep compression applied to each block that a deduplication (or 'dedupe') engine may create. For a dedupe engine that typically creates 8 KB blocks, for example, parts are selected from the 0% and 100% compressibility streams such that their sum is about 8K. So, for a 75% desired compression, 2 KB of data comes from the 0% compressible stream and 6 KB comes from the 100% compressible stream. However, the same result would not be achieved if 250 KB were picked from 0% compressible stream followed by 750 KB from the 100% compressible stream. Thus, the particular way in which data is mixed has implications with respect to the compressibility ultimately achieved in a mixed data stream which includes that data.

For example, a dedupe engine may need a particular average, or overall, compressibility in a data stream, but in this particular case, the compressibility should not always be the same in the data stream. Thus, the compression logic in this example would be configured in such a way that the average compressibility over a larger number of blocks is the desired value, although the compressibility of any given block, or even a group of blocks, may not be the average compressibility.

To illustrate with an example, a mixed data stream might be configured so that 20% of the blocks have a compressibility of 65%, 20% of the blocks have a compressibility of 70%, 20% of the blocks have a compressibility of 75%, 20% of the blocks have a compressibility of 80%, and 20% of the blocks have a compressibility of 90%. This would produce a mixed stream having an average compressibility of 75%, even though only 20% of the blocks have 75% compressibility. This variation, in the mixed data stream, of compressibility may more accurately reflect some real world data streams than would a mixed data stream having blocks that are all 75% compressible. As discussed below, uniform, random, normalized, and clustered, mixing of blocks may determine where, in a sequence of blocks, blocks of different compressibility are created.

For example, one technique for mixing data streams is to uniformly mix, or merge, the data of the constituent streams.

For example, if a 100G stream is to have 90% unique data, and 10% common data, a nonuniform mixing of the data is to arrange the data in serial fashion where, for example, the 10% common data is followed by the 90% unique data, or vice versa. In contrast, a uniform mixing of the data might take the form, for example, of data arranged in the mixed data stream thus: 1 MB (common), 9 MB (unique), 1 MB (common), 9 MB (unique) . . . until a mixed data stream of 100 GB is defined. In this way, the common data and the unique data are uniformly distributed in the mixed data stream. In some cases, it may be useful to set a minimum size for the chunks or groupings of data. In the example above, the chunks are either 1 MB or 9 MB. If the chunk size is too small, a deduplication server may not be able to discern commonalties in the data and, as a result, all of the data in the data stream may, incorrectly, appear to be unique to the deduplication server.

In the example of FIG. 3, the output data stream from the mixer 308 reflects the application of a uniform mixing process to the input data streams. Particularly, the output data stream is of the form: 2 parts (AB—from incompressible stream), followed by 1 part (X—from compressible stream), followed by 2 blocks (CD—from incompressible stream), followed by 1 part (X—from compressible stream), followed by 2 parts (EF from incompressible stream), followed by 1 block (X—from compressible stream) . . . and so forth.

Another method of mixing data streams is to mix the data randomly. In this approach to mixing data streams, the chunk sizes are random. In contrast, in the preceding example, the chunk sizes are not random but are either 1 MB or 9 MB. For example, chunk sizes may be selected as 100K, 75K, 125K . . . . In this case, the stream size of the mixed stream may be specified, such as 100 GB for example. As well, a minimum and/or maximum chunk size may be specified, and random chunk sizes within those bounds may be specified. With reference to the foregoing example, a minimum chunk size of 50K may be specified and/or a maximum chunk size of 150K may be specified. As noted, the minimum chunk size may help to ensure that the granularity of the mixed stream is not so fine that a deduplication server would fail to recognize common data in the mixed stream.

Still another approach to mixing, or merging, multiple data streams involves a normalized mixing of the data from the constituent data streams. In a data stream exhibiting normalized mixing, the data chunks may be arranged thus: unique data; mixed data; unique data. Thus, in a data stream with normalized mixing, the mixed data is distributed in a particular portion, or portions, of the data stream.

Yet another approach to mixing or merging multiple data streams involves a clustered mixing of the data in the data stream. In particular, the mixed data stream may be configured such that the data stream includes portions where data of the constituent streams is not mixed together, and the data stream includes other portions where data of the constituent data streams is mixed together.

It is noted that multiple different mixing techniques may be employed in connection with a particular mixed data stream. Thus, the techniques noted above are presented by way of example only, and still other techniques can be defined and implemented that employ two or more mixing processes to create a mixed data stream.

F. Aspects of Some Example Methods

Figure 5:
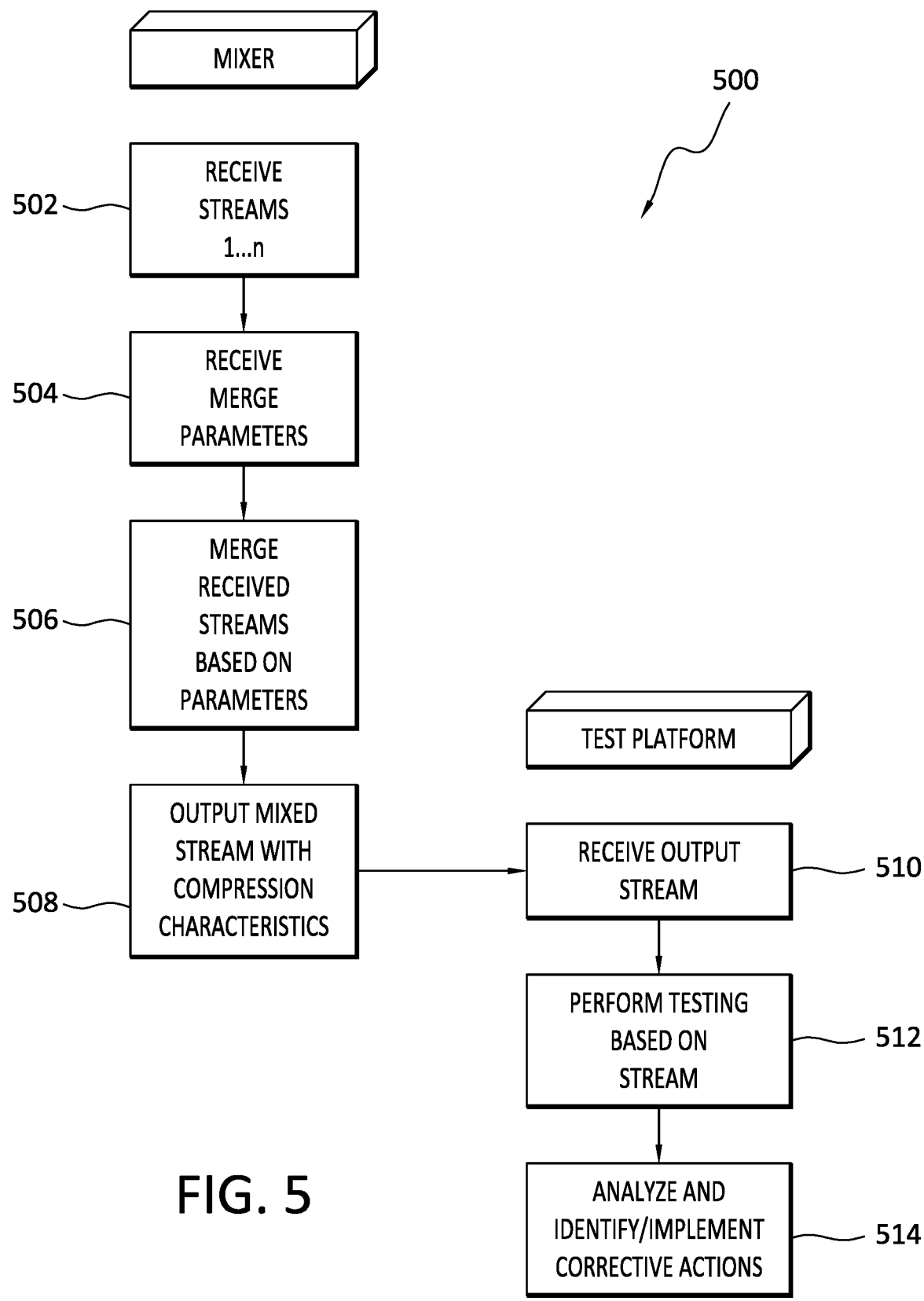
FIG. 5 is a flow diagram that discloses some general aspects of a method for generating mixed data streams.

With reference now to FIG. 5, details are provided concerning aspects of example methods for mixing two or more data streams, where one example of such a method is denoted generally at 500. The method 500 may be performed by and/or at the direction of a mixer, examples of which are disclosed herein. Some parts of the method 500 may be performed by other entities, such as a test platform for example. In general however, the functional allocation indicated in FIG. 5 is provided only by way of example and, in other embodiments, the functions disclosed in FIG. 5 may be allocated in various other ways.

The method 500 may begin at 502 when multiple data streams 2 . . . n, where n is ≥2, are received at a mixer. One or more of the data streams may be received from a data generator. As well, one or more of the data streams may be received from an entity specifically configured to generate data streams. In some cases, two or more of the data streams are received from a common entity, while in other cases, two or more of the data streams are received from different respective entities. Each of the received data streams may have respective compressibility characteristics.

After, or before, receipt of the 'n' data streams 502, the mixer may also receive inputs in the form of one or more merging parameters 504 that are usable by the mixer to create a mixed data stream having particular characteristics. Such characteristics include, for example, compressibility and commonality. The merging parameters 504 may be received from a user by way of a UI or API for example. In some embodiments, the mixer may affirmatively access a library, for example, and retrieve one or more of the merging parameters.

Using the merging parameters, the mixer is then able to merge 506 the received data streams to create a mixed data stream having characteristics specified by the merging parameters. The data streams may be merged together 506 in any of a variety of ways. For example, the mixer may employ a uniform, random, normalized, or clustered mixing process, or a combination of these, to generate 506 the output data stream.

The mixed data stream can then be output 508 by the mixer. The mixed data stream possesses the compressibility characteristics specified by the merge parameters. The mixer may output 508 the mixed data stream to any of a variety of recipients. In some cases, the mixed data stream may be stored. Additionally, or alternatively, the mixed data stream may be output to 508, and received by 510 a test platform.

The test platform may use the data stream as a basis for performing testing operations 512. The testing operations 512 may involve, for example, providing the data stream to an application and/or hardware, and then observing and recording the response of the application and/or hardware to the data stream. In at least some embodiments, the data stream mimics, or duplicates, real world conditions. In this way, personnel, such as developers, are able to observe the response of an application, for example, to the data. The response of the application and/or hardware may be stored in some embodiments. As well, simulated streams according to embodiments of the invention may be used by customers to test the effectiveness of a dedupe solution that the customer is considering to purchase, since the customer may not want to send their real data to the new platform under consideration either for security concerns or for the concern related to breaking their normal operating environment.

The data stream and/or the response information may then be analyzed 514. Among other things, such analysis 514 may involve identifying any problems with the operation of the application and/or hardware to which the data stream was supplied during testing 512. The analysis 514 may also include identifying and implementing one or more corrective actions to resolve the problems that were identified during testing 512.

In this way, embodiments of the invention enable testing of applications and other software, as well as hardware, for example, during a development process so as to help ensure that the applications, software, and hardware, will operate as expected. This may reduce, or eliminate, one or more problems that would otherwise be experienced by a purchaser and/or user of the applications, hardware, and software. Further, because mixed data streams generated according to embodiments of the invention are highly configurable in terms of their compressibility and commonality, at least, such mixed data streams can be generated to suit a variety of conditions and scenarios. Various other advantages of example embodiments of the invention will be apparent from the present disclosure.

G. Example Computing Devices and Associated Media

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein.

As indicated above, embodiments within the scope of the present invention also include computer storage media, which are physical media for carrying or having computer-executable instructions or data structures stored thereon. Such computer storage media can be any available physical media that can be accessed by a general purpose or special purpose computer.

By way of example, and not limitation, such computer storage media can comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which can be used to store program code in the form of computer-executable instructions or data structures, which can be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' can refer to software objects or routines that execute on the computing system. The different components, modules, engines, and services described herein may be implemented as objects or processes that execute on the computing system, for example, as separate threads. While the system and methods described herein can be implemented in software, implementations in hardware or a combination of software and hardware are also possible and contemplated.

In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention can be performed in client-server environments, whether network or local environments, or in any other suitable environment. Suitable operating environments for at least some embodiments of the invention include cloud computing environments where one or more of a client, server, or other machine may reside and operate in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
   receiving a mixed data stream that was generated using a first data stream and a second data stream, the mixed data stream having a compressibility of N, where N is a compressibility merging parameter, and the mixed data stream has a compressibility that is between a compressibility of the first data stream and a compressibility of the second data stream;
   providing the mixed data stream as an input to an application and/or to hardware;
   recording a response of the application and/or of the hardware to the mixed data stream input; and
   analyzing the response of the application and/or of the hardware to the mixed data stream input.

2. The method as recited in claim 1, wherein the mixed data stream is provided to the application, and the application is a data deduplication application.

3. The method as recited in claim 1, wherein analyzing the response of the application and/or of the hardware comprises identifying any problems with the operation of the application and/or of the hardware.

4. The method as recited in claim 3, wherein analyzing the response of the application and/or of the hardware comprises identifying and implementing a corrective action associated with an identified problem.

5. The method as recited in claim 1, further comprising modifying the application and/or the hardware based on an outcome of the analyzing.

6. The method as recited in claim 1, further comprising modifying the compressibility N of the mixed data stream.

7. The method as recited in claim 1, wherein the mixed data stream was generated based in part on a seed, and one of the first data stream and the second data stream is incompressible.

8. The method as recited in claim 1, wherein the mixed data stream has a particular commonality factor (CF) with respect to the first data stream and the second data stream.

9. The method as recited in claim 1, wherein the mixed data stream comprises an interleaving of data of the first data stream with data of the second data stream.

10. The method as recited in claim 1, wherein data in the mixed data stream embodies any one or more of the following mixes of data of the first data stream and data of the second data stream: a uniform mix; a random mix; a clustered mix; or, a normalized mix.

11. A non-transitory storage medium having stored therein computer-executable instructions which are executable by one or more hardware processors to perform operations comprising:

receiving a mixed data stream that was generated using a first data stream and a second data stream, the mixed data stream having a compressibility of N, where N is a compressibility merging parameter, and the mixed data stream has a compressibility that is between a compressibility of the first data stream and a compressibility of the second data stream;

providing the mixed data stream as an input to an application and/or to hardware;

recording a response of the application and/or of the hardware to the mixed data stream input; and analyzing the response of the application and/or of the hardware to the mixed data stream input.

12. The non-transitory storage medium as recited in claim 11, wherein the mixed data stream is provided to the application, and the application is a data deduplication application.

13. The non-transitory storage medium as recited in claim 11, wherein analyzing the response of the application and/or of the hardware comprises identifying any problems with the operation of the application and/or of the hardware.

14. The non-transitory storage medium as recited in claim 13, wherein analyzing the response of the application and/or of the hardware comprises identifying and implementing a corrective action associated with an identified problem.

15. The non-transitory storage medium as recited in claim 1, wherein the operations further comprise modifying the application and/or the hardware based on an outcome of the analyzing.

16. The non-transitory storage medium as recited in claim 11, wherein the operations further comprise modifying the compressibility N of the mixed data stream.

17. The non-transitory storage medium as recited in claim 11, wherein the mixed data stream was generated based in part on a seed, and one of the first data stream and the second data stream is incompressible.

18. The non-transitory storage medium as recited in claim 11, wherein the mixed data stream has a particular commonality factor (CF) with respect to the first data stream and the second data stream.

19. The non-transitory storage medium as recited in claim 11, wherein the mixed data stream comprises an interleaving of data of the first data stream with data of the second data stream.

20. The non-transitory storage medium as recited in claim 11, wherein data in the mixed data stream embodies any one or more of the following mixes of data of the first data stream and data of the second data stream: a uniform mix; a random mix; a clustered mix; or, a normalized mix.

* * * * *